United States Patent [19]

Hamuro et al.

[11] Patent Number: 5,796,616
[45] Date of Patent: Aug. 18, 1998

[54] APPARATUS FOR AUTOMATICALLY REPLENISHING CHIPS

[75] Inventors: Mitsuro Hamuro, Otsu; Keiichi Shimamaki, Shiga-ken, both of Japan

[73] Assignee: Murata Manufacturing Co., Ltd., Japan

[21] Appl. No.: 590,126

[22] Filed: Jan. 23, 1996

[30] Foreign Application Priority Data

Jan. 23, 1995 [JP] Japan .................. 7-027428

[51] Int. Cl.$^6$ .................................................. G06F 19/00
[52] U.S. Cl. .................... 364/468.28; 364/479.12; 29/740
[58] Field of Search ............. 364/468.28, 479.01, 364/479.1, 479.12, 479.13, 479.14; 29/739–741, 832–840

[56] References Cited

U.S. PATENT DOCUMENTS

| | | | |
|---|---|---|---|
| 4,459,743 | 7/1984 | Watanabe et al. | 29/740 |
| 5,228,193 | 7/1993 | Yanagawa et al. | 29/832 |
| 5,319,846 | 6/1994 | Takahashi et al. | 29/740 |
| 5,400,497 | 3/1995 | Watanabe et al. | 29/740 |

FOREIGN PATENT DOCUMENTS 63-127600  5/1988  Japan .................. H05K 13/02

Primary Examiner—Reba I. Elmore
Assistant Examiner—Steven R. Garland
Attorney, Agent, or Firm—Ostrolenk, Faber, Gerb & Soffen, LLP

[57] ABSTRACT

An alignment/feed mechanism includes a container for receiving a plurality of chips, and an outlet port through which the chips are fed one by one in an aligned fashion. A sensor is operable to detect whether the number of the chips within the container is reduced below a predetermined level. If below the level, additional chips are fed from a chip tank into the container through a replenishment line or pipe. The chip tank is located above the alignment/feed mechanism. An on-off valve is disposed in the replenishment line and operable to open the replenishment line in response the sensed result of the sensor and close the replenishment line when a required number of additional chips are fed to the container.

11 Claims, 8 Drawing Sheets

APPARATUS FOR AUTOMATICALLY REPLENISHING CHIPS

BACKGROUND OF THE INVENTION

1. Field of the Invention

The present invention relates to an apparatus for automatically replenishing an alignment/feed mechanism with chips. The alignment/feed mechanism is designed to align and feed the chips one by one.

2. Description of the Related Art

Heretofore, a chip mounting machine has been employed to automatically mount chips onto a printed circuit board. In order to linearly align a plurality of randomly supplied chips and feed them one by one, the chip mounting machine requires an alignment/feed mechanism, better known as a bulk feeder.

To this end, there is proposed an automatic chip alignment/feed apparatus with a cartridge-type chip case, as disclosed by Japanese laid-open patent publication No. Sho 63-127600.

The chip case can be used as a container during shipping of chips. This chip case may also be directly assembled to a chip mounting machine.

A typical chip case can contain a large number of chips, for example, 5,000 to 100,000 chips, although this number may vary depending on the types of chips. However, such a large number of chips tend to be used up within a relatively short period of time since a chip mounting machine is operated at high speeds. Thus, there is a need to monitor the number of chips used, to remove an empty chip case from the body of an alignment/feed mechanism, and to replace it with a new chip case. The chip mounting machine stops for four to six seconds during loading of a printed circuit board. But it is impossible to replace the empty chip case within such a short period of time. So, the chip mounting machine has to be stopped for a significant period of time to replace the chip case. This deteriorates the operating efficiency of the machine. Replacement of chip cases requires an operator near the chip mounting machine. It is thus difficult to automate the replenishment operation.

As the size of the chip case increases, the frequency in which the chip case must be replaced decreases. However, there is a limitation on the practical size of the chip case. This is because the alignment/feed apparatus constitutes a part of the chip mounting machine, and plurality of those are arranged in parallel in the thickness direction so as to simultaneously feed different types of chips. Moreover, the alignment/feed apparatus must be reciprocated at high speeds in response to movement of the chip mounting machine. It is therefore necessary to avoid an increase in the weight of the alignment/feed apparatus. For this reasons, the chip case should be thin and relatively small.

Accordingly, it is an object of the present invention to provide an apparatus for automatically replenishing a container space with chips when the number of chips within the container space of an alignment/feed mechanism is reduced below a predetermined level.

SUMMARY OF THE INVENTION

In order to achieve the foregoing object, the present invention provides an apparatus for automatically replenishing chips, comprising an alignment/feed mechanism wherein a container space within which a plurality of chips are contained, and an outlet port from which the chips are fed one by one in an aligned manner, characterized by a sensor for detecting whether the number of chips within the container space is reduced below a reference level, a chip tank located above the alignment/feed mechanism and designed to contain more chips than the container space, a replenishment line through which the chips are fed from the chip tank to the container space, and on-off means disposed in the replenishment line for opening the replenishment line in response to the sensor and closing the replenishment line when a predetermined number of additional chips are fed to the container space.

The chip tank preferably contains a sufficient number of chips, for example more than 1,000,000 chips, so that it is not necessary to replenish the chips for about one month.

Where a plurality of alignment/feed mechanisms are arranged in parallel in order to feed different types of chips, it is preferable to provide and arrange a plurality of chip tanks in parallel as well.

In a preferred embodiment, the container space has an inlet port at its rear end to receive chips to be replenished. The replenishment line includes a pipe which is capable of vertical expansion and contraction and allows the chips to pass therethrough. It is also preferable to provide means for horizontally moving at least either the chip tank or the alignment/feed mechanism so as to bring one of them into vertical alignment with the other, and means for vertically moving the lower end of the pipe so as to insert the lower end of the pipe into the inlet port.

In another preferred embodiment, the replenishment line includes a flexible tube through which the chips can pass. In this case, it is preferable to provide means for gripping the lower end of the tube so as to move it upwardly from the container space and to insert it into the container space.

The alignment/feed mechanism intends to align chips within the container space and discharge the chips one by one from the outlet port. The sensor is operable to detect whether the number of the chips within the container space is reduced below a reference level. If below this level, the on-off means is opened to allow the chips within the chip tank to be fed through the replenishment line into the container space due to its tare weight. The on-off means is closed when the chips are fed above a predetermined level. As this occurs, the chips are no longer fed into the container space so as to prevent the container space from being overfilled with additional chips.

The chip mounting machine needs not be stopped if chips can be fed during operation of the chip mounting machine. This would improve operating efficiency. However, it is difficult to allow the automatic replenishing apparatus to cooperate with the alignment/feed apparatus since the alignment/feed apparatus for use with a one-by-one type chip mounting machine is operated at high speeds. To this end, the replenishment of chips may be carried out while a printed circuit board is being loaded onto the chip mounting machine (for four to six seconds). The present invention enables replenishment of chips for a short period of time since the replenishment line is used to replenish the container space with chips. No replacement of chip cases takes place.

BRIEF DESCRIPTION OF THE DRAWINGS

For the purpose of illustrating the invention, there is shown in the drawing several forms which are presently preferred, it being understood, however, that the invention is not limited to the precise arrangements and instrumentalities shown.

The present invention will now be described by way of example with reference to the accompanying drawings, in which.

DESCRIPTION OF THE PREFERRED EMBODIMENTS

Figure 1:
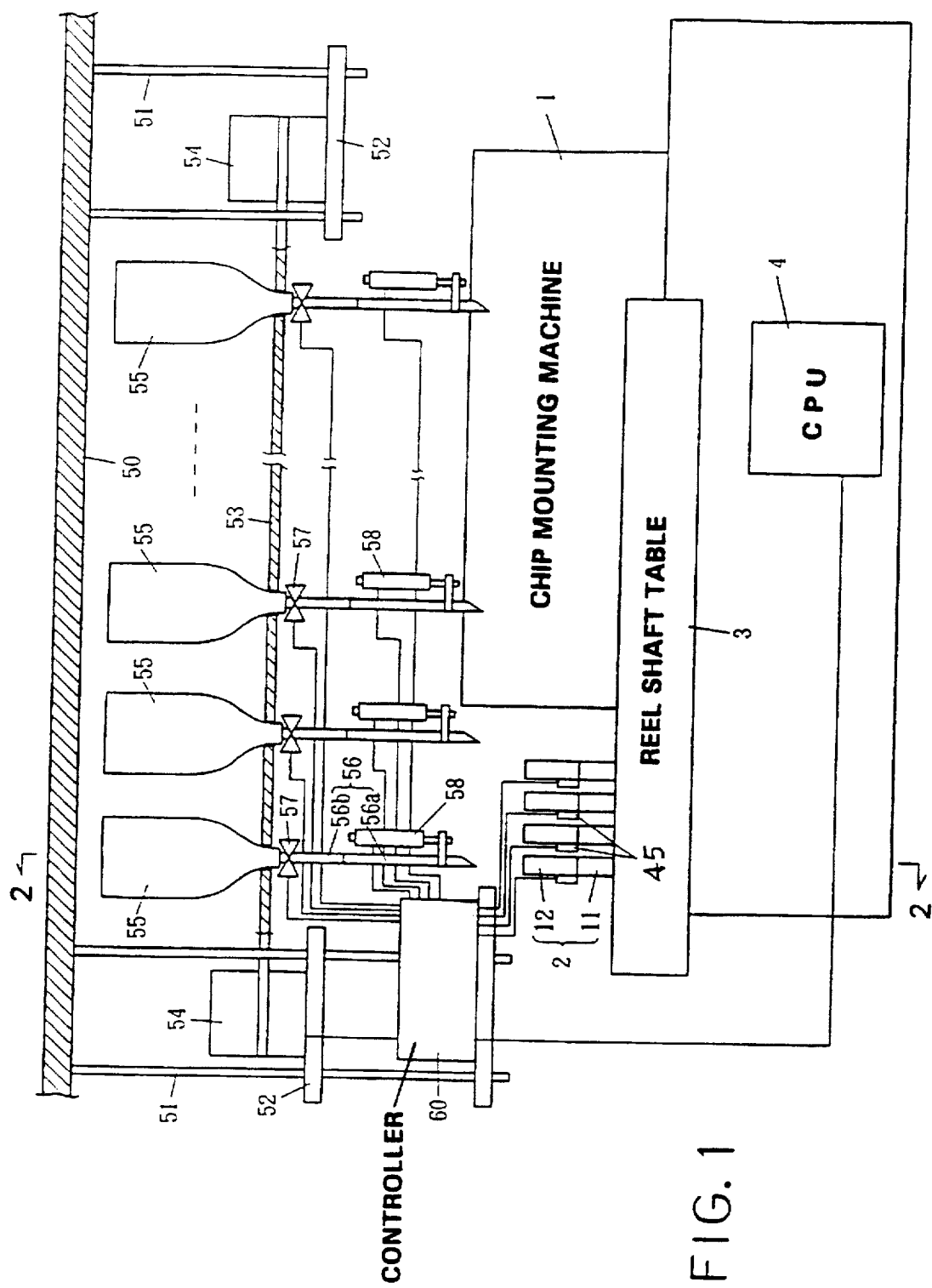
FIG. 1 is an overall view of an automatic replenishing machine according to one embodiment of the present invention.
Figure 2:
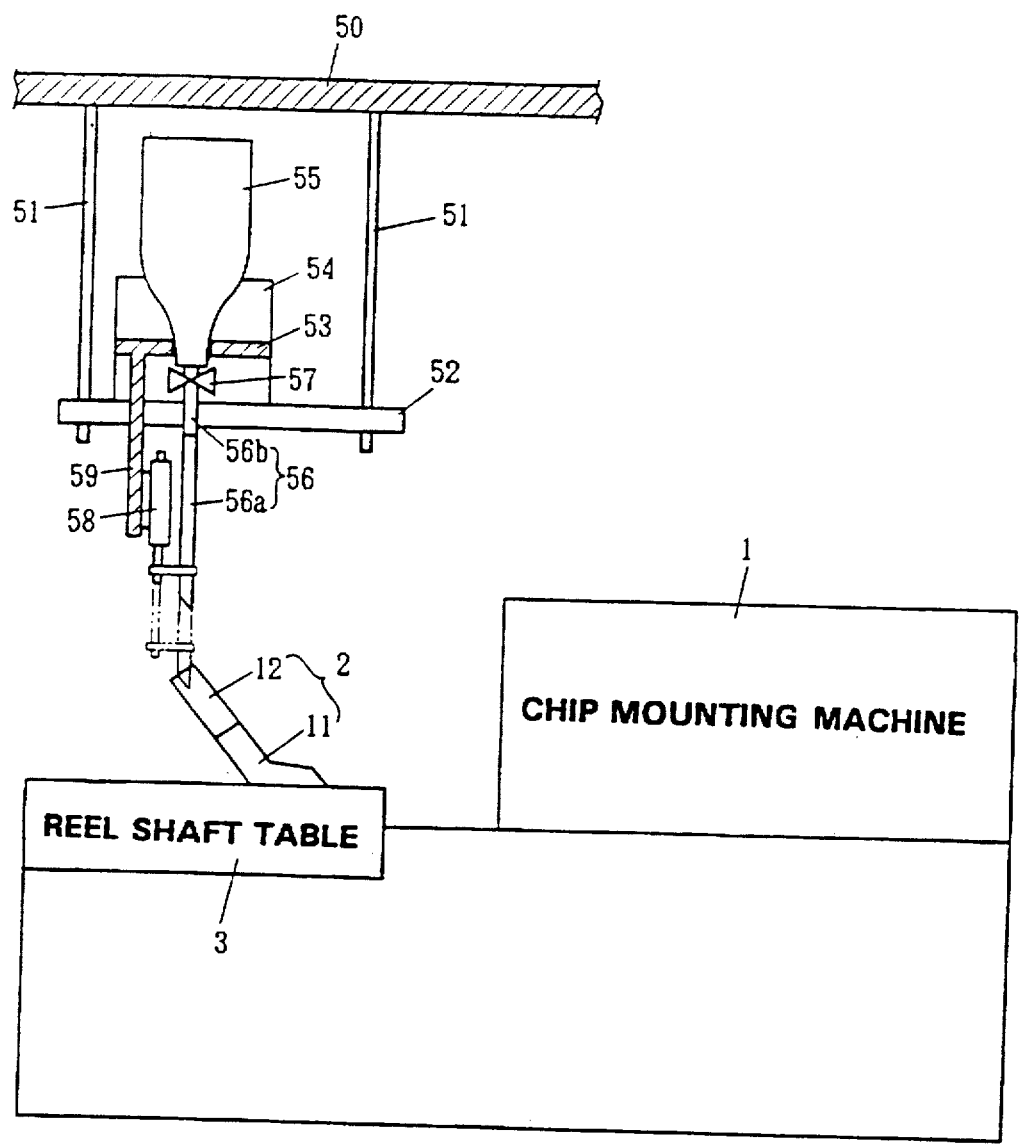
FIG. 2 is a sectional view taken on the line A—A in FIG. 1.

Referring now to the drawings wherein like numerals indicate elements, FIGS. 1 and 2 illustrates a first embodiment showing the manner in which the present invention may be applied to a chip mounting machine.

The reference numeral 1 denotes a one-by-one type chip mounting machine. 2 is a bulk feeder serving as an alignment/feed apparatus. 3 is a reel shaft table horizontally movable relative to the chip mounting machine 1. A plurality of bulk feeders 2 are placed on the upper surface of the reel shaft table (e.g., an X-Y table) 3 and arranged in parallel in the thickness direction of the reel shaft table 3.

In FIG. 1, four bulk feeders 2 are mounted to the chip mounting machine 1. The number of the bulk feeders 2 may vary depending on the types of chips used.

Figure 3:
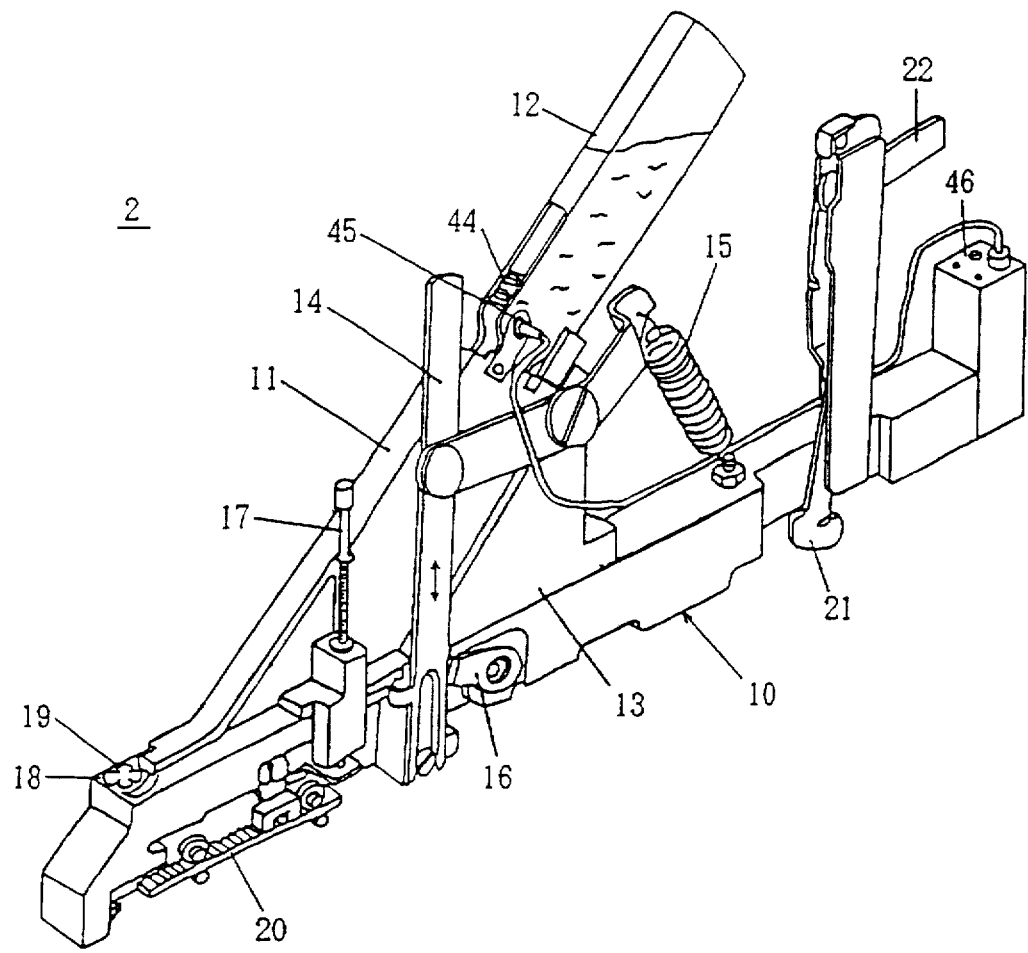
FIG. 3 is a perspective view of a bulk feeder.
Figure 4:
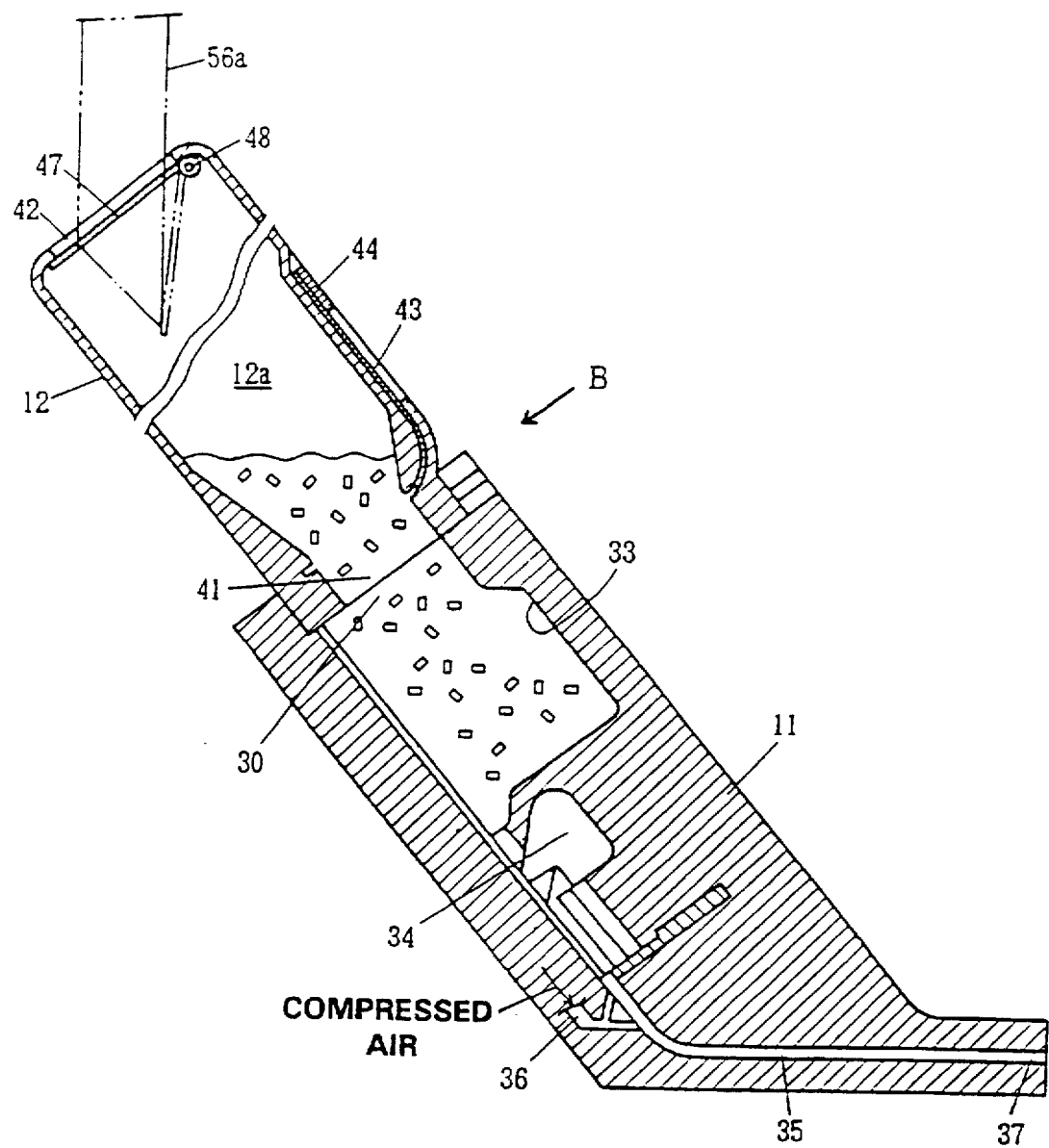
FIG. 4 is a sectional view of a bulk cassette and a chip case.

As best shown in FIGS. 3 and 4, each of bulk feeder 2 includes various known components to which have been added a chip case 12, a chip presence sensor 45, and a sensor sensitivity adjuster 46, each of which will be described later.

As shown in FIG. 3, the bulk feeder 2 includes a body 10, a bulk cassette 11 detachably mounted to the body 10, and a chip case 12 detachably connected to the bulk cassette 11. The body 10 is associated with a triangular base 13 for supporting the bulk cassette 11 obliquely at an angle of approximately 45°, a vertically movable feed lever 14, a return spring 15 for urging the feed lever 14 in an upward direction, a mechanical valve 16 for selectively feeding air under pressure, an index pin push lever 17, an index table 18, an index wheel 19, and a rack-and-pinion mechanism 20.

When the feed lever 14 is pressed down, the mechanical valve 16 into the bulk cassette 11. At this time, the rack-and-pinion mechanism 20 is operated to rotate the index wheel 19 by a fixed angle (for example, approximately 90°). The index wheel 19 has a plurality of recesses arranged in a circumferentially 90° spaced relationship and adapted to receive chips one at a time. After a chip is discharged from the outlet port of the bulk cassette 11, it is received in one of the recesses of the index wheel 19. The chip is then rotated by a predetermined angle and stopped at a predetermined position on the index table 18. The index pin push lever 17 is also lowered when the feed lever 14 is pressed down. The index pin push lever 17 is associated with a suitable mechanism, not shown, so as to allow a pin (not shown) to push the chip upwardly from the index table 18 during downward movement of the index pin push lever 17. The chip is then gripped by the chip mounting machine 1 and removed from the bulk feeder 2.

A clamp pawl 21 and a clamp lever 22 are attached to the rear end of the body 10. The body 10 is secured to the reel shaft table 3 by the clamp pawl 21 which in turn, is operated by the clamp lever 22.

Figure 5:
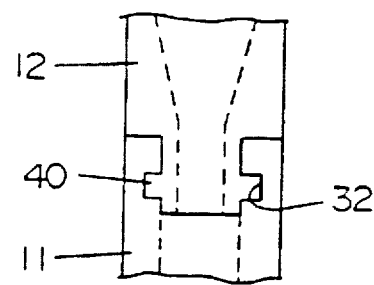
FIG. 5 is a partial view of the bulk cassette and the chip case as seen in the direction of the arrow B in FIG. 4.

As shown in FIG. 4, the bulk cassette 11 has an inlet port 30 at its rear end. The chip case 12 is detachably mounted to the inlet port 30. In the embodiment shown in FIG. 5, the bulk cassette 11 has a pair of grooves 32. The chip case 12 has a corresponding pair of projections 40 which are slidably fit within the grooves 32 so as to securely mount the chip case 12 to the bulk cassette 11. At this time, the inlet port 30 of the bulk cassette 11 corresponds to and communicates with an opening 41 of the chip case 12.

A number of chips are transferred from the chip case 12 to the bulk cassette 11. The chips are first introduced into a large chamber 33, then enter a small chamber 34, and are finally moved into an alignment passage 35. Two compressed air openings 36 are defined adjacent to the inlet end of the alignment passage 35. Compressed air is injected from these openings 36 when the mechanical valve 16 is opened. The chips within the small chamber 34 are then urged into the alignment passage 35 one by one. Those chips which have previously been introduced into the alignment passage 35 are then pushed in a forward direction (rightwardly as viewed in FIG. 4). An outlet port 37 is defined in the bulk cassette 11 adjacent to the front end of the alignment passage 35. The chips are discharged from the outlet port 37 one by one. The internal structure of the bulk cassette 11 is similar to that disclosed in Japanese laid-open patent publication No. Hei 3-187298 and will not be described herein.

The chip case 12 is preferably transparent and made of resin. The chip case 12 has openings 41, 42 at its front and rear ends, respectively. The front opening 41 is closable by a slidable elongated plate 43. The elongated plate 43 is in the form of a flexible thin plate and has a manually operable knob 44 at its rear end. With the chip case 12 mounted to the bulk cassette 11, the elongated plate 43 is slid in such a direction as to open the opening 41 so as to feed chips from the chip case 12 into the bulk cassette 11. A chip presence sensor 45 (see FIG. 3) is attached to the chip case 12 adjacent to its opening 41. This sensor 45 is designed to detect whether the number of chips within the chip case 12 is below a predetermined level. The sensor 45 is preferably of the reflection type, but may be of the transmission type or any other types (for example, contact sensor or mechanical switch). A sensor sensitivity adjuster 46 is preferably mounted to the rear end of the bulk feeder body 10. The sensor 45 is connected to a controller 60 through the sensor sensitivity adjuster 46.

Figure 6:
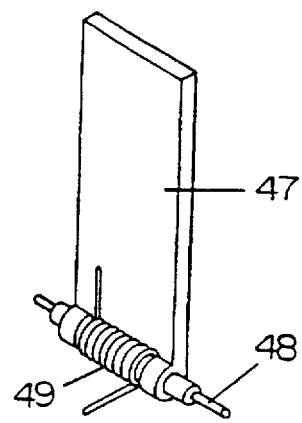
FIG. 6 is a perspective view of a closure member.

A closure plate 47, which can be moved inwardly, is mounted to the opening 47 at the rear end of the chip case 12. As shown in FIG. 6, the closure plate 47 is rotatable about a horizontal pin 48 and is urged under the action of a coil spring 49 so as to normally close the opening 42. The lower end of a replenishment piping 56 is inserted through the opening 42. At this time, the replenishment piping 56 pushes the closure plate 47 so as to open the opening 42. This enables a smooth supply of chips from the piping 56 to the chip case 12.

Reference will next be made to the automatic replenishing apparatus.

As shown in FIG. 1, a top plate 50 is mounted above the reel shaft table 3. A plurality of hanger posts 51 depend from the top plate 50. A plurality of shelves 52 are secured to the hanger posts 51. A single shaft drive mechanism 54 is mounted on one of the shelves 52 so as to drive or move a support table 53 in a horizontal direction. This drive mechanism 54 is operated under the control of the controller 60. A plurality of chip tanks 55 are supported, in an inverted fashion, by the support table 53. The chip tanks 55 contain different types of chips, for example on the order of 1,000,000 each. Four tanks 55 are shown in FIG. 1, but any number of tanks may be used. The replenishment piping 56 is releasably connected to the open bottom of each of the chip tanks 55. An on-off valve 57 is disposed between the piping 56 and the chip tank 55 and is operated under the control of the controller 60.

The replenishing piping 56 is composed of two pipes 56a, 56b which are slidable relative to each other. The lower pipe 56a is vertically moved by an air cylinder 58. The air cylinder 58 is mounted to a vertical wall 59 (see FIG. 2) which in turn, is fixed to the lower surface of the support table 53. The air cylinder 58 is also operated under the control of the controller 60. When the air cylinder 58 is actuated, the pipe 56a is moved downwards. The lower end of the pipe 56a is then inserted into the chip case 12. The lower end of the pipe 56a is sharply pointed. This facilitates insertion of the pipe 56a into the chip case 12. The piping 56 preferably has a circular cross section, but may have a rectangular cross section. The piping 56 may take any other shapes as long as chips can smoothly be moved through the piping.

The controller 60 is operatively associated with the chip mounting machine 1 and controls the drive mechanism 54, the on-off valve 57 and the air cylinder 58. The drive mechanism 54, the on-off valve 57, and the air cylinder 58 cooperate to automatically replenish the chip case with chips. The controller 60 is also connected to a central processing unit (CPU) 4 so that the controller 60 and the chip mounting machine 1 are operatively associated with one another. The CPU 4 not only controls the chip mounting machine 1, but also drives the reel shaft table 3 in synchronism with movement of the chip mounting machine 1. The CPU 4 also sends instructional signals so as to actuate the feed lever 14 and the index pin push lever 17.

Figure 7:
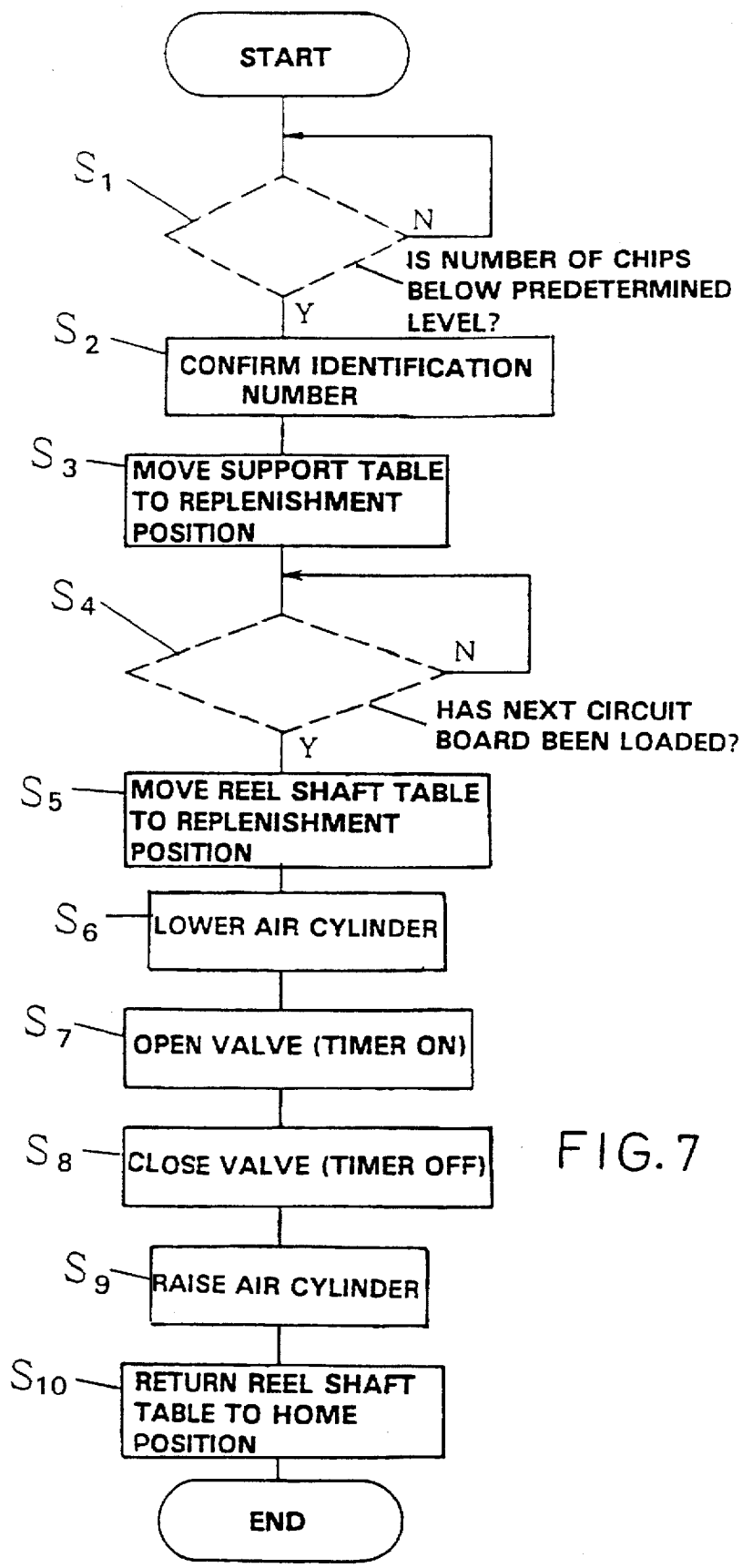
FIG. 7 is a flow chart showing operation of the automatic replenishing apparatus of the present invention.

Operation of the automatic replenishing apparatus thus constructed will now be described with reference to FIG. 7.

When a printed circuit board is introduced or loaded onto the chip mounting machine 1, the chip mounting machine 1 is operable to mount chips, which are fed from the bulk feeder 2, to the printed circuit board one by one. When all of the chips have been mounted to the printed circuit board, the printed circuit board is transferred to the next station. Another printed circuit board is then loaded onto the chip mounting machine 1. During loading of a new printed circuit board, the chip mounting machine must be temporarily stopped for about four to six seconds.

During mounting of the chips, the chip presence sensor 45 detects whether the number of the chips within the chip case 12 is below a predetermined level (step S1). The chip presence sensor 45 sends a corresponding signal to the controller 60. The controller 60 will then take all the necessary steps to replenish chips to be mounted to the next printed circuit board. Specifically, confirmation is made on the identification number of the empty chip case 12 (step S2). The support table 53 is then moved to locate a chip tank 55 with the same identification number as the empty chip case 12 above the bulk feeder 2 at a replenishment position (step S3).

While loading of the next printed circuit board takes place (step S4), the CPU 4 is operable to move the reel shaft table 3 to the replenishment position (step S5) so as to locate the bulk feeder 2 with the empty chip case 12 directly below the chip tank 55 with the same identification number as the empty chip case 12. Referring to FIG. 1, the leftmost bulk feeder 2 is vertically aligned with the leftmost chip tank 55. Next, the controller 60 lowers the air cylinder 58 (step S6). The lower end of the replenishment pipe 56a is inserted into the opening 42 of the chip case 12. Substantially at the same time, the controller 60 opens the on-off valve 57 (step S7). As a result, chips drop from the chip tank 55 under the force of gravity, pass through the piping 56, and then enter the chip case 12. When a predetermined period of time has passed after the on-off valve 57 is opened, the controller 60 closes the on-off valve 57 (step S8). The on-off valve 57 is kept opened until the chip case 12 is substantially filled with, but before it overflows with, the chips. When the chip case 12 is replenished with the chips, the controller 60 raises the air cylinder 58 (step S9) and the pipe 56a is removed from the chip case 12. When the air cylinder 58 is moved up, the CPU 4 returns the reel shaft table 3 to its home position (step S10).

While replenishment of the chips is being carried out, the printed circuit board is simultaneously loaded onto the chip mounting machine. Loading of the printed circuit board is completed substantially at the same time as replenishment of the chips is completed. After the printed circuit board has been loaded, the chip mounting machine 1 is operable to again initiate mounting of the chips in a usual manner.

As thus far described, replenishment of chips is carried out while a printed circuit board is being loaded. Accordingly, there is no need to stop operation of the chip mounting machine 1 for each replenishing operation. The chip mounting machine 1 is thus capable of continuous operation.

In this embodiment, the support table 53 is moved in a horizontal direction so as to bring the chip tank 55 into vertical alignment with an empty bulk feeder 2. The invention is not limited to the illustrated arrangement. Alternatively, the reel shaft table 3 may be moveable and the support table 53 with the chip tanks 55 may be fixed or both elements can be moveable.

Figure 8:
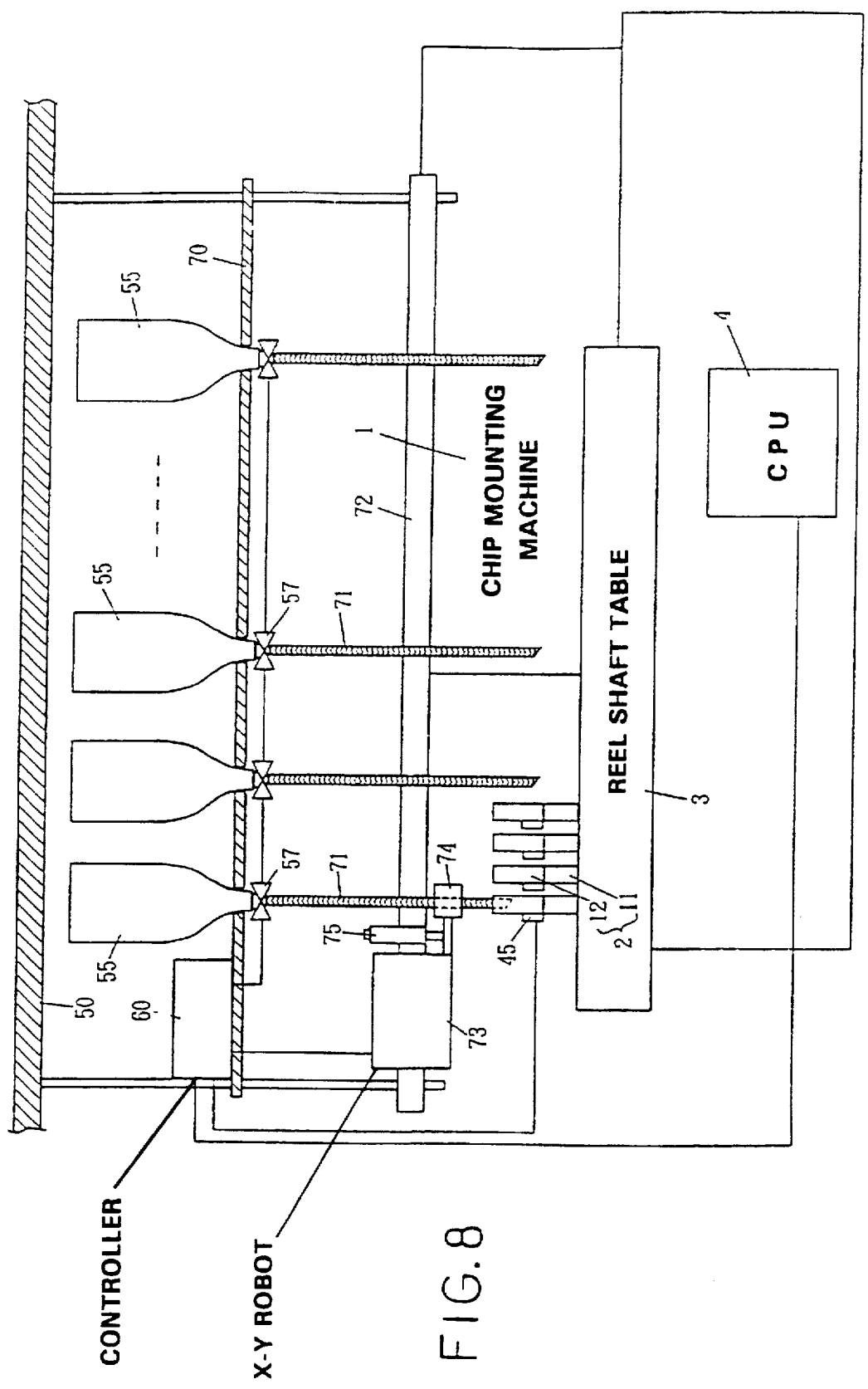
FIG. 8 is an overall view of an automatic replenishing apparatus according to a second embodiment of the present invention.
Figure 9:
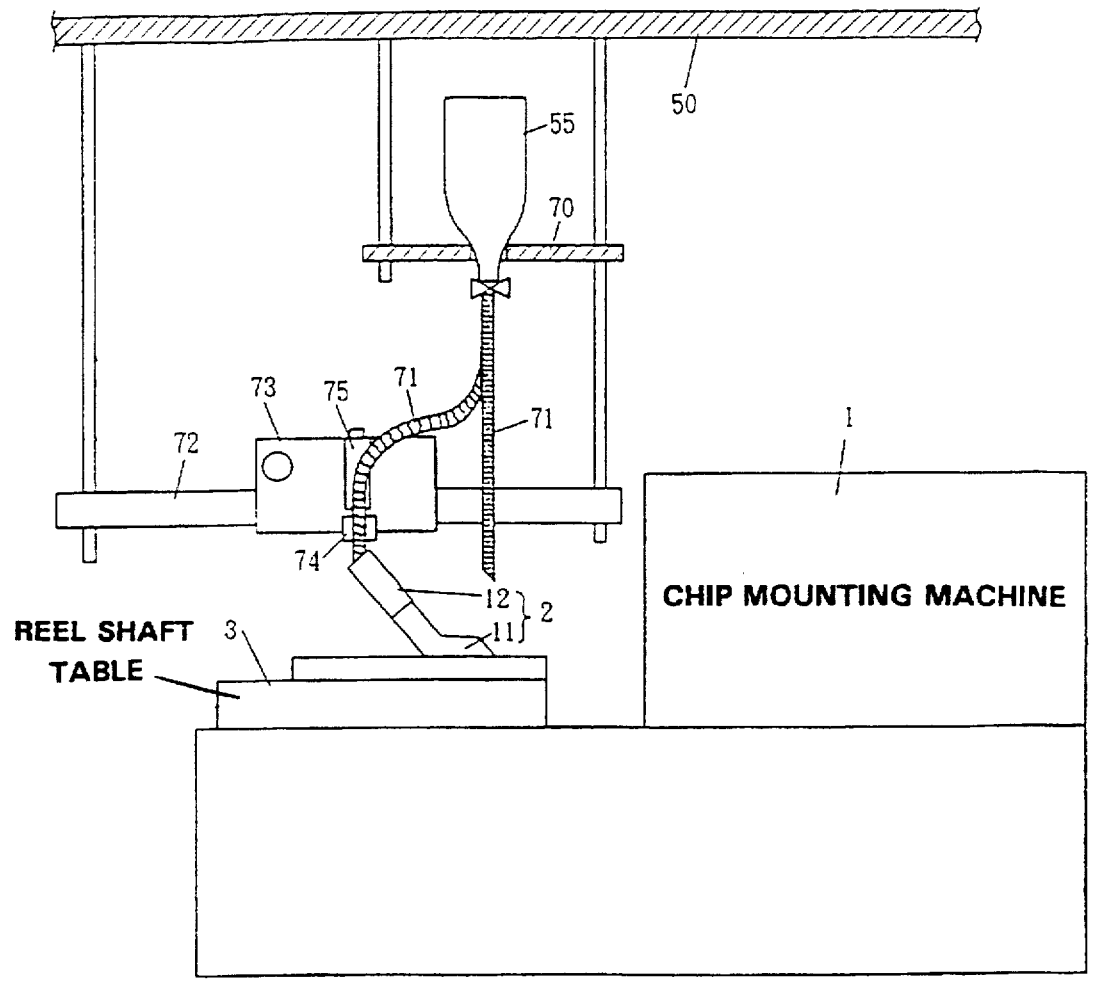
FIG. 9 is a right side view of the automatic replenishing apparatus shown in FIG. 8.

FIGS. 8 and 9 show an automatic replenishing apparatus acceding to a second embodiment of the present invention.

In these figures, like parts are given like reference numerals and will not be described herein.

A shelf 70 is suspended from the top wall 50 so as to support a plurality of chip tanks 55. The chip tanks 55 are thus supported in a fixed position. A flexible tube 71 is releasably connected to the open bottom or lower end of each of the chip tanks 55. The on-off valve 57 is disposed between the tube 71 and the chip tank 55 and is operable under the control of the controller 60.

The tubes 71 are positioned so as not to interfere with the bulk feeder 2 during operation of the bulk feeder 2.

A horizontal shelf 72 is fixed below the shelf 70. A X-Y robot 73 is mounted to the shelf 72. The robot 73 is movable in a X-Y (horizontal) direction along the shelf 72 under the control of the controller 60. The robot 73 includes a chuck hand 74 for gripping the lower end of the tube 71, and a cylinder 75 for vertically moving the chuck hand 74. The chuck hand 74 is first caused to grip the lower end of the tube 71 which is suspended in a fixed position. Thereafter, the cylinder 75 is operable to raise the tube 71. The robot 73 is moved in a horizontal direction so as to bring the tube 71 into vertical alignment with the desired bulk feeder 2. The cylinder 75 is again operable so as to insert the lower end of the tube 71 into the opening 42 of the chip case 12.

After the tube 71 has been inserted into the chip case 12, the controller 60 opens the on-off valve 57 as in the first embodiment. A fixed amount of chips is then fed from the chip tank 55 through the tube 71 into the chip case 12. The on-off valve 57 is thereafter closed. The cylinder 75 is again operable to raise the tube 71. Thereafter, the chuck hand 74 is opened to release the tube 71. This causes the tube 71 to be returned to its home or suspended position under the influence of its own resiliency.

In the illustrated embodiment, the chip tank 55 is supported in a fixed position. If the bulk feeder 2 is moved away from the chip tank 55, it is necessary to bend the flexible tube 71 to a substantial extent. Also, it is necessary to provide a long tube 71 such that chips can be replenished even if the bulk feeder 2 and the chip tank 55 are separated to a maximum extent. To this end, the reel shaft table 3 is driven to move the bulk feeder 2 with an empty chip case 12 to a position near the chip tank 55. This eliminates the need to substantially bend the tube 71 and allows for the use of a short tube.

It will be appreciated that the present invention is not limited to the foregoing embodiments.

In the first and second embodiments, replenishment of chips is carried out while a printed circuit board is being loaded. Alternatively, the chip tank 55 or the tube 71 may be moved in synchronism with the bulk feeder 2 during mounting of the chips so as to replenish an empty chip case 12 with the chips. In such a case, there is no need to stop the chip mounting machine during replenishing operation. This results in a substantial improvement in operating efficiency.

The present invention is also applicable to a chip mounting machine wherein one of two bulk feeders is in a stand-by position while the other bulk feeder is involved in the mounting of chips. In such a case, the automatic replenishing apparatus is operable to replenish the bulk feeder in the stand-by position with chips. This eliminates the need to operate the automatic replenishing apparatus at high speeds since a sufficient time is made available.

In the foregoing embodiments, chips are fed to the bulk cassette through the chip case. Alternatively, chips may be fed directly to the bulk cassette in the event that the bulk case has such a volume as to contain a sufficient number of chips. This alternative arrangement eliminates the need for a chip case.

The present invention is applicable not only to a chip mounting machine, but also other machines (for example, automatic taping machine) as far as they are provided with an alignment/feed apparatus.

As thus far described, the sensor detects whether the number of chips within the container space has fallen below a predetermined level. If so, a predetermined amount of chips is fed from the chip tank through the replenishment line to the container space. This automates the chip replenishment operation. In contrast to the prior art, there is no need to mount or remove chip cases since additional chips are fed through the replenishment line. The present invention enables operation of the chip mounting machine substantially in a continuous manner. No stoppage of the machine takes place. This results in a substantial improvement in operating efficiency.

The present invention has been described with respect to its preferred embodiments. It will be understood that a variety of modifications and changes may be made without departing from the spirit and scope of the invention as defined in the appended claims.

What is claimed is:

1. An apparatus for automatically replenishing chips, the apparatus comprising;

an alignment/feed mechanism having a container for storing a plurality of chips and an outlet port for discharging the chips one by one from the container in an aligned manner, and a sensor for detecting whether the number of the chips within the container is below a reference level;

a chip tank designed to store more chips than the container; the chip tank being located above the alignment/feed mechanism;

structure for moving the chip tank and the alignment/feed mechanism relative to one another so as to bring the chip tank and the alignment/feed mechanism into operational alignment with one another;

the container having an inlet port for receiving additional chips;

a replenishment line through which the chips are fed from the chip tank to the container, the replenishment line including a pipe capable of vertical expansion and contraction and adapted to allow the chips to pass therethrough;

an on-off device disposed in the replenishment line, the on-off device being operable to open the replenishment line in response to the sensor indicating that the number of chips in the container is below the reference level and to close the replenishment line when a predetermined number of chips have been fed to the container; and a mechanism for vertically moving the lower end of the pipe so as to insert the lower end of the pipe into the inlet port.

2. An apparatus for automatically replenishing chips according to claim 1, wherein the structure for moving the chip tank and the alignment/feed mechanism relative to one another moves at least one of them horizontally and the operational alignment is a vertical alignment.

3. An apparatus for automatically replenishing chips according to claim 2, wherein the inlet port is located in a rear end of the container remote from the outlet port.

4. An apparatus for automatically replenishing chips, the apparatus comprising;

an alignment/feed mechanism having a container for storing a plurality of chips and an outlet sort for discharging the chips one by one from the container in an aligned manner, and a sensor for detecting whether the number of the chips within the container is below a reference level;

a chip tank designed to store more chips than the container;

a replenishment line through which the chips are fed from the chip tank to the container; the replenishment line including a flexible tube through which the chips can pass;

structure adapted to move the flexible tube into and out of the container; and an on-off device disposed in the replenishment line, the on-off device being operable to open the replenishment line in response to the sensor indicating that the number of chips in the container is below the reference level and to close the replenishment line when a predetermined number of chips have been fed to the container.

5. An apparatus for automatically replenishing chips according to claim 4, wherein the structure adapted to move the flexible tube includes structure for gripping the lower end of the flexible tube.

6. An apparatus for automatically replenishing chips according to claim 5, wherein the container has an inlet port located in a rear end of the container and the flexible tube is moved into and out of the container space through the inlet port.

7. An apparatus for automatically replenishing chips according to claim 6, wherein the inlet port is located in a rear end of the container remote from the outlet port.

8. An apparatus for automatically replenishing chips, the apparatus comprising;
- a plurality of alignment/feed mechanisms, each alignment/feed mechanism having a container for storing a plurality of chips and an outlet port for discharging the chips one by one from the container in an aligned manner, the plurality of alignment/feed mechanisms being arranged in parallel so as to feed different types of chips;
- a plurality of chip tanks located above the alignment/feed mechanisms, each of the chip tanks being designed to store more chips than any of the containers;
- a supply mechanism which supplies additional chips from a selected one of the chip tanks to any container whose supply of chips has fallen below a reference level, the supply mechanism comprising at least one replenishment line for transferring chips from the chip tanks to the containers;
- each of the containers having a respective inlet port and the replenishment line includes a flexible tube through which the chips can pass; and
- structure for gripping the lower end of the flexible tube and moving the flexible tube into and out of the containers.

9. An apparatus for automatically replenishing chips, the apparatus comprising;
- a plurality of alignment/feed mechanisms, each alignment/feed mechanism having a container for storing a plurality of chips and an outlet port for discharging the chips one by one from the container in an aligned manner, the plurality of alignment/feed mechanisms being arranged in parallel so as to feed different types of chips;
- a plurality of chip tanks located above the alignment/feed mechanisms, each of the chip tanks being designed to store more chips than any of the containers; and
- a supply mechanism which supplies additional chips from a selected one of the chip tanks to any container whose supply of chips has fallen below a reference level, said supply mechanism comprising:
- a plurality of sensors, each sensor being associated with a different alignment/feed mechanism for detecting whether the number of chips in the container of its associated alignment/feed mechanism has fallen below a reference level;
- a plurality of replenishment lines through which chips are fed from the chip tanks to the containers, each replenishment line being associated with a respective chip tank; and
- a control mechanism coupled to the sensors for causing chips to be transferred from a selected one of the chip tanks to that container whose number of chips has fallen below the reference level via the replenishment line associated with that container, the control mechanism including structure for moving the selected one of the chip tanks and the container whose number of chips has fallen below the reference level into operational alignment with one another.

10. An apparatus for automatically replenishing chips according to claim 9, wherein:
- each of the containers has an inlet port for receiving additional chips;
- each of the replenishment lines includes a pipe capable of vertical expansion and contraction and adapted to allow the chips to pass therethrough; and
- the control mechanism includes structure for lowering the lower end of the pipes into the containers.

11. An apparatus for automatically replenishing chips according to claim 9, wherein each of the replenishing lines includes a flexible tube through which chips can pass and wherein the control mechanism moves the flexible tubes into and out of the containers.

* * * * *